United States Patent
Suzuki

(10) Patent No.: US 6,326,655 B1
(45) Date of Patent: Dec. 4, 2001

(54) SOLID STATE IMAGING DEVICE HAVING A GATE ELECTRODE FORMED OVER A POTENTIAL DIP

(75) Inventor: Ryoji Suzuki, Kanawaga (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/273,271

(22) Filed: Mar. 22, 1999

(30) Foreign Application Priority Data

Mar. 23, 1998 (JP) .................................. 10-074392

(51) Int. Cl.$^7$ .................................. H01L 27/148
(52) U.S. Cl. ..................... 257/239; 257/240; 257/223
(58) Field of Search .................................. 257/239, 240, 257/257, 258, 291, 292, 223

(56) References Cited

U.S. PATENT DOCUMENTS

| 4,148,048 | 4/1979 | Takemoto et al. |
| 5,199,053 | * 3/1993 | Hirama ................................. 257/239 |
| 5,286,989 | * 2/1994 | Yonemoto ............................. 257/239 |
| 5,357,129 | * 10/1994 | Kamimura ............................. 257/239 |
| 5,539,226 | * 7/1996 | Kawamoto et al. .................. 257/239 |

* cited by examiner

Primary Examiner—Minh Loan Tran
(74) Attorney, Agent, or Firm—Sonnenschein, Nath & Rosenthal

(57) ABSTRACT

To improve such a fact that a signal electric charge from a sensor unit in an MOS imaging device can not be completely read out by a low read-out voltage. To this end, in an arrangement in which a plurality of unit pixels each of which has a sensor unit (S) with a photoelectric conversion region (20) as well as an insulating gate transistor MOS for reading out a signal electric charge from the sensor unit (S) are disposed, a photoelectric conversion region of the sensor unit (S) is so constructed as to form a single potential dip for the signal electric charge and a gate electrode (18) of the insulating gate transistor (MOS) is formed into a pattern in which the middle portion in a channel width direction thereof is positioned above the central portion of the potential dip or its vicinity.

6 Claims, 5 Drawing Sheets

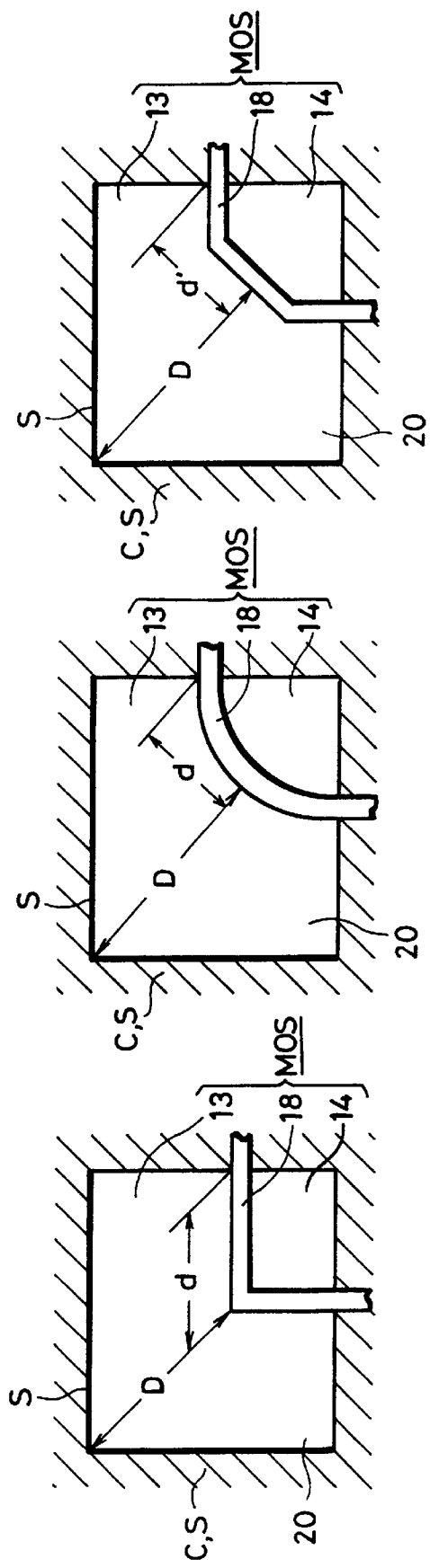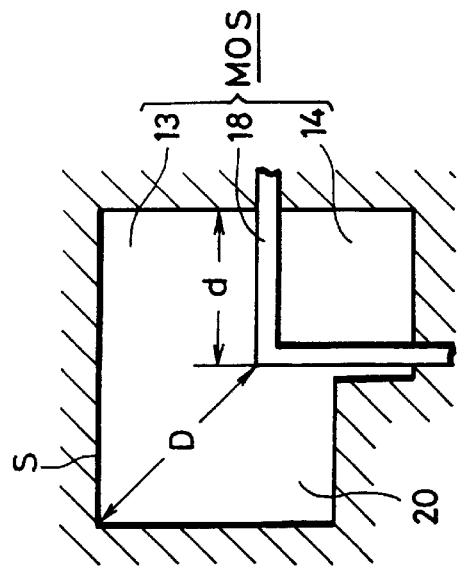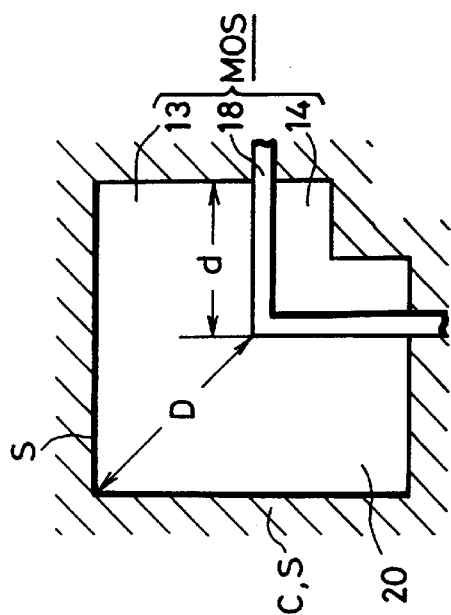

SOLID STATE IMAGING DEVICE HAVING A GATE ELECTRODE FORMED OVER A POTENTIAL DIP

RELATED APPLICATION DATA

The present application claims priority to Japanese Application No. P10 074392 filed Mar. 23, 1998 which application is incorporated herein by reference to the extent permitted by law.

BACKGROUND OF THE INVENTION

1. Field of the Invention

The present invention relates to a solid state imaging device and particularly, to an MOS-type solid state imaging device having an MOS transistor (MOS referred to by this specification is a general term for a conductive layer/an insulating film/semiconductor structure) and its manufacturing method.

2. Description of the Related Art

FIG. 1 shows a block diagram of an essential portion of a MOS-type solid state imaging device with a so-called FD (Floating Diffusion)-type arrangement. The arrangement of the solid state imaging device is such that a plurality of unit pixels 101 (only one unit pixel is shown in FIG. 1) are disposed in a plurality of rows and columns, that is, in the horizontal and vertical directions, and each unit pixel 101 has a sensor unit consisting of a photoelectric conversion element by a photo-diode 102 and in which a signal electric charge obtained by the sensor unit is read out by an FD read-out MOS transistor 103 and the signal electric charge is amplified to a signal voltage or signal electric current by an FD amplifying MOS transistor 104 in each unit pixel.

In the arrangement of FIG. 1, it is a case of an arrangement in which the signal amplification is carried out in each unit pixel 101, but as the block diagram of an essential portion in FIG. 2 shows, a so-called column amplifier-type solid state imaging device in which an amplifier is disposed at, for example, every common column can be made.

In the column amplifier-type solid state imaging device too, there is provided an arrangement such that a plurality of unit pixels 201 (also in FIG. 2, one unit pixel is only shown) are respectively disposed in a plurality of rows and columns, that is, in the horizontal and vertical directions, and each unit pixel 201 has a photo-diode 202 as the photoelectric conversion element in its sensor unit, and in which an MOS transistor 203 for reading out a signal electric charge accumulated in the photo-diode 202 and a selecting MOS transistor 204 for reading out the signal electric charge to a vertical signal line 208 are formed and a column amplifier 205 is disposed at every vertical signal line 208.

The photoelectric conversion element, that is, the photodiode and the MOS transistor which carries out read-out of the electric charge therefrom at the sensor unit in each of the unit pixels 101 and 201 of these MOS-type solid state imaging devices are made a complex arrangement in which one semiconductor region constituting the photo-diode, for example, a cathode region is made to serve as a source region of the MOS transistor.

FIG. 6 shows a schematic plan pattern view of a sensor unit S and a forming portion of the MOS transistor which reads out the signal electric charge therefrom.

The sensor unit S is formed with a photoelectric conversion region 1 formed to constitute the photo-diode. The MOS transistor (MOS) is comprised of the photoelectric conversion region 1 as its source, a semiconductor region 2 as its drain, which is formed with a predetermined distance, that is, a distance corresponding to a channel length away from the photoelectric conversion region and a gate electrode 3 formed between them through a gate insulating film (not shown).

The sensor unit S is formed in one corner of, for example, the unit pixels 101 and 202 respectively explained in connection with FIG. 1 and FIG. 2 and the gate electrode 3 is formed to be displaced toward other circuit device forming portion side in the unit pixel.

The above-mentioned MOS-type imaging device has, because of being comprised of the MOS transistor, an advantage of fundamentally reducing power consumption in comparison with, for example, a CCD (charge-coupled device)-type imaging device, but there have occurred some problems in the fact that a signal electric charge is completely read out from the above-mentioned sensor unit at a low read-out voltage by the read-out transistor.

SUMMARY OF THE INVENTION

An object of the present invention is to solve these problems. That is, the inventor of the present invention has investigated that the cause of incompleteness of the read-out voltage and in reading out the signal electric charge in the read-out MOS transistor resides in the positional relations between the sensor unit and the gate portion of the read-out MOS transistor. Specifically, it has been investigated that according to the conventional structure, because the disposed position of the gate electrode is formed apart from a potential dip for a signal electric charge in the photoelectric conversion region of the sensor unit, when the signal electric charge is read out, it becomes necessary to increase the read-out voltage, that is, the gate voltage for the read-out MOS transistor or it is difficult to completely read out the signal electric charge and so, in order to completely carry out the read-out, a further large read-out voltage is needed.

The present invention is, based on the investigation, to provide a solid state imaging device to be able to nearly completely read out the signal electric charge from the sensor unit with a low read-out voltage and particularly, an MOS imaging device.

An arrangement of a solid state imaging device according to the present invention is such that a plurality of unit pixels, each having a sensor unit with a photoelectric conversion region in which a first semiconductor region of a second conductivity-type is formed in a semiconductor region of a first conductivity-type, and on a surface thereof, a high impurity concentration layer of a first conductivity type is formed and an insulating gate transistor for reading out a signal electric charge from the sensor portion, are disposed.

Then, the photoelectric conversion region in the sensor unit is so arranged as to form a single potential dip for the signal electric charge and the gate electrode for the insulating gate transistor is formed into such a pattern that the middle portion thereof in a channel width direction is positioned above the central portion of the potential dip or its vicinity.

As mentioned above, in the present invention, because the potential dip to be formed in the photoelectric conversion region is singly formed as well as the gate electrode of the MOS transistor for reading out the signal electric charge is formed to extend above the central portion of the potential dip, that is, on the top of the dip or at a position nearly as the top, it is possible to read out the signal electric charge from a portion lower than the most highest portion of a potential barrier in the periphery of the dip, thereby making it possible to lower the read-out voltage and further, completely carry out the read-out of the signal electric charge.

BRIEF DESCRIPTION OF THE DRAWINGS

FIGS. 5A to 5E are respectively pattern diagrams of the sensor unit and an insulating gate transistor related to the solid state imaging device according to the present invention.

DESCRIPTION OF THE PREFERRED EMBODIMENTS

Figure 1:
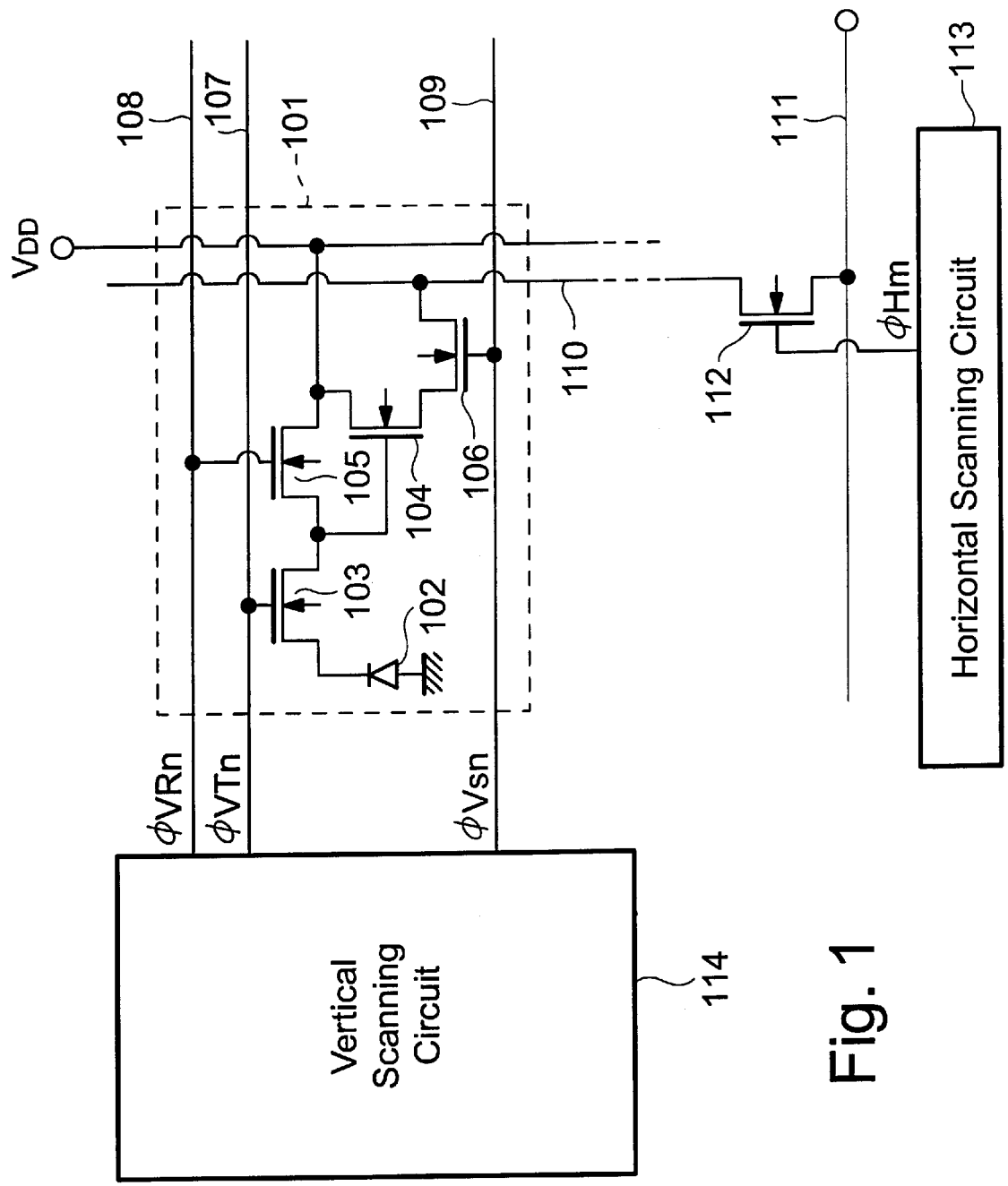
FIG. 1 is a block diagram showing an essential portion of one example of a solid state imaging device according to the present invention.

According to the present invention, one embodiment of an MOS-type solid state imaging device can be made an MOS-type solid state imaging device of an FD-type shown in FIG. 1. The solid state imaging device is, as mentioned earlier, made a so-called amplifying-type imaging device with an arrangement such that a plurality of unit pixels 101 are respectively disposed in a plurality of rows and columns, that is, in the horizontal and vertical directions, and each unit pixel 101 has a sensor unit for carrying out photoelectric conversion and a signal electric charge obtained in the sensor unit is read out by the MOS transistor 103 and signal the electric charge is amplified to a signal voltage or a signal electric current by the MOS transistor 104 in each unit pixel.

The unit pixel 101 of the solid state imaging device has a photo-diode 102 as a photoelectric conversion element in the sensor unit, an FD read-out MOS transistor 103 for reading out a signal electric discharge accumulated in the photo-diode 102, an FD amplifying MOS transistor 104, an FD resetting MOS transistor 105 and a vertical selecting MOS transistor 106.

A gate electrode of the FD read-out MOS transistor 103 is connected to a vertical reading out line 107, a gate electrode of the FD resetting MOS transistor 105 is connected to a vertical resetting line 108, a gate electrode of the vertical selecting MOS transistor 106 is connected to a vertical selecting line 109 and a source of the vertical selecting MOS transistor 106 is connected to a vertical signal line 110, respectively.

Reference numeral 111 is a horizontal signal line and a horizontal selecting MOS transistor 112 is connected between the horizontal signal line 111 and the vertical signal line 110, and a horizontal pulse $\Phi_{Hm}$ from a horizontal scanning circuit 113 is applied to a gate electrode of the horizontal selecting MOS transistor 112.

Then, by vertical scanning pulses $\Phi_{Sn}$, $\Phi_{Tn}$ and $\Phi_{Rn}$ from a vertical scanning circuit 114 for selecting the row, the signal electric charge accumulated in the photo-diode 102 of each unit pixel 101 at every row is read out by the read-out MOS transistor 103, amplified by the amplifying MOS transistor 104 and selected by the vertical selecting MOS transistor 106. Then, through the horizontal selecting MOS transistor 112 controlled by the horizontal scanning pulse $\Phi_{Hm}$ from the horizontal scanning circuit 113 for selecting the column, each pixel signal is outputted to the horizontal signal line 111. On the other hand, each unit pixel 101 is reset by the resetting MOS transistor 105.

Figure 2:
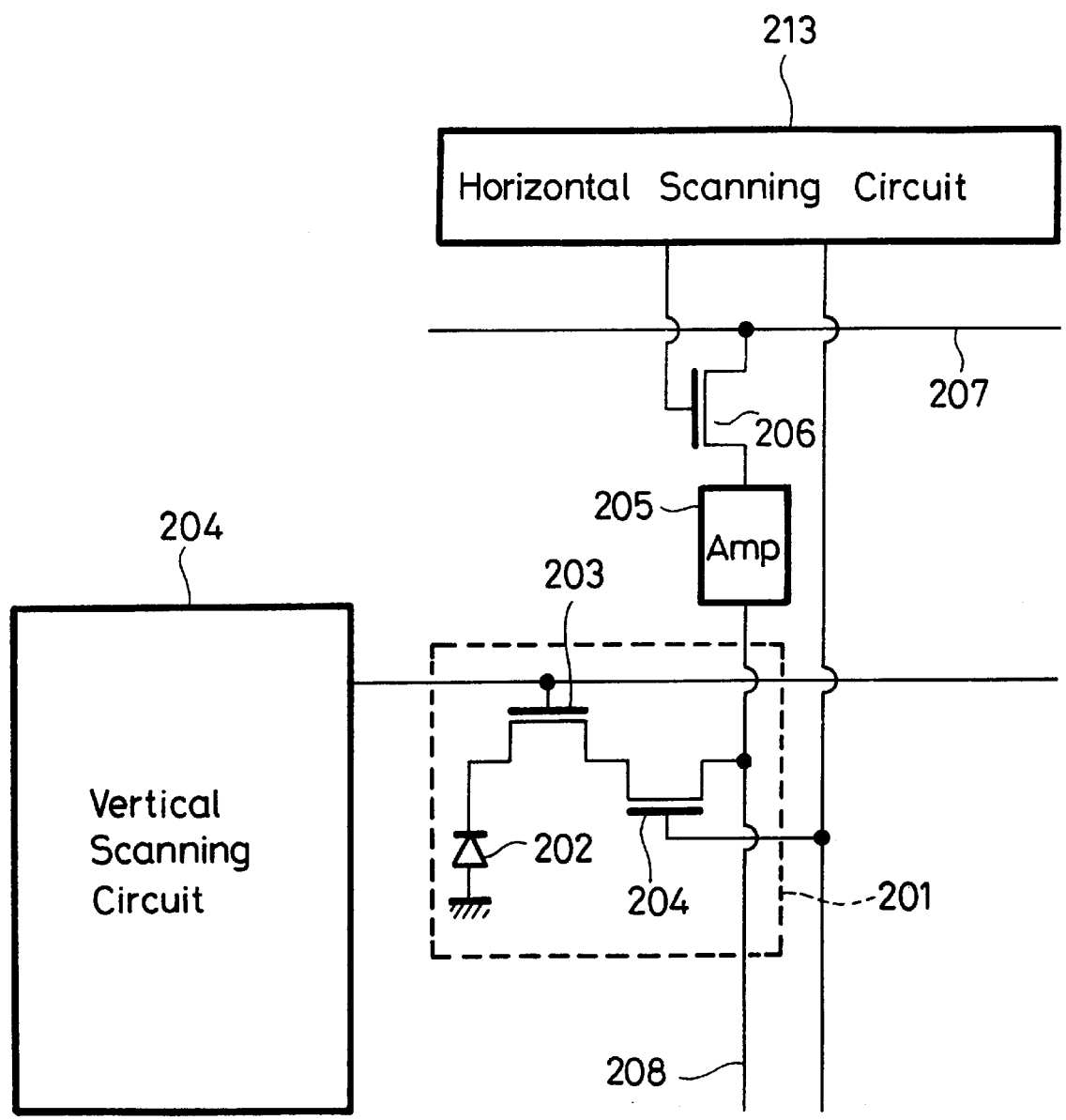
FIG. 2 is a block diagram showing an essential portion of one example of a solid state imaging device according to the present invention.

Meanwhile, another embodiment of the MOS transistor-type solid state imaging device according to the present invention is capable of constituting an MOS-type solid state imaging device of a so-called column amplifying-type shown in FIG. 2. In this solid state imaging device too, as explained already, an amplifier is disposed at every common column.

The solid state imaging device too is such that a plurality of unit pixels 201 are disposed in a plurality of rows and columns, that is, in the horizontal and vertical directions and each unit pixel 201 has a photo-diode 202 as the photoelectric conversion element in the sensor unit thereof, a selecting MOS transistor 203 for reading out a signal electric charge accumulated in the photo-diode 202 and a horizontal read-out MOS transistor 204 for reading out the signal electric charge to a vertical signal line 208.

The MOS transistor 203 has a so-called switch function for reading out an electric charge by the that fact it is switched on by a vertical scanning pulse from a vertical scanning circuit 214 being applied to the gate electrode thereof and the MOS transistor 204 reads out the signal electric charge to the vertical signal line 208 with a horizontal scanning pulse from a horizontal scanning circuit 213 being applied to the gate electrode thereof. Then, the signal electric charge read out to the vertical signal line 208 is amplified by an amplifier 205 and an output of the signal electric charge from a unit pixel on a selected column is outputted to a horizontal signal line 207 by a horizontal selecting MOS transistor 206.

However, the solid state imaging device according to the present invention is not limited to the arrangement of the solid state imaging devices shown in FIG. 1 and FIG. 2, but can be applied to various kinds of MOS-type solid state imaging devices in order to implement reduction of, for example, a fixed pattern noise in these solid state imaging devices.

In the solid state imaging devices according to the present invention too, the sensor unit and the signal electric charge read-out MOS transistor in each of unit pixels are made a compound arrangement with the source region of the MOS transistor being comprised of the photoelectric conversion region constituting the sensor unit.

Figure 3:
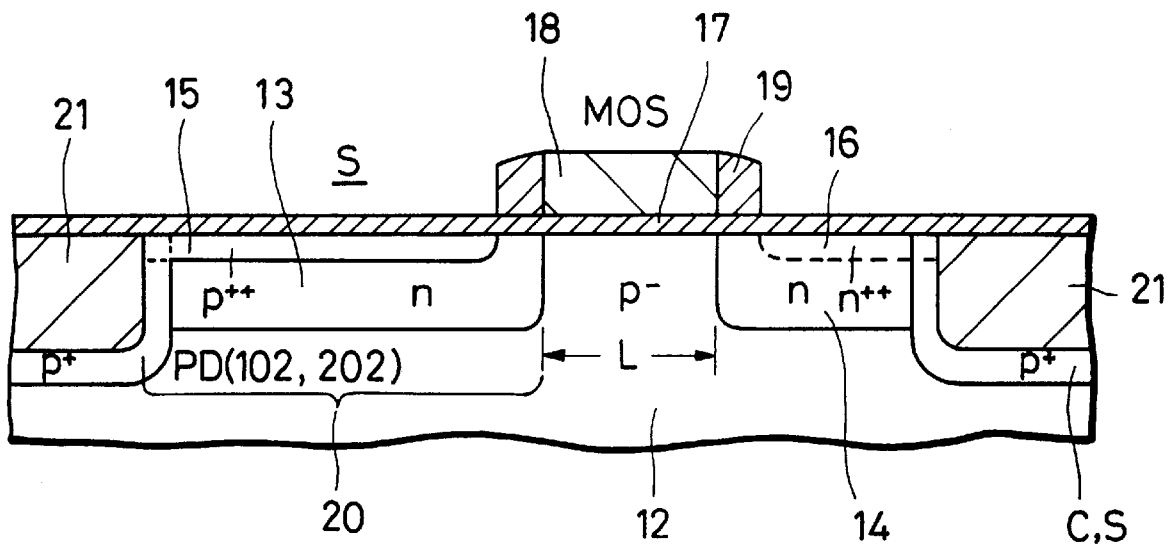
FIG. 3 is a schematic cross sectional view of one example of an essential portion of the solid state imaging device according to the present invention.

The arrangement is, for example, as a schematic cross sectional view thereof in FIG. 3 shows, such that a first conductivity-type, for example, p-type semiconductor region 12 which is made to have a low impurity concentration is formed on a second conductivity-type, for example, n-type semiconductor substrate, or p-type semiconductor region 12, which itself is a semiconductor substrate and on the p-type semiconductor region 12 are formed second conductivity-type, for example, n-type first and second semiconductor regions 13 and 14 at an interval L corresponding to a channel length of the signal electric charge read-out MOS transistor.

Then, a first conductivity-type, in this example, p-type high impurity concentration layer 15 is formed on the first semiconductor region 13. In this manner, there is formed a so-called HAD (Hole Accumulated Diode)-type photo-diode PD (for example, the photo-diodes 102 and 202 in FIG. 1 and FIG. 2), that is, a photoelectric conversion region 20 of $p^{++}/n/p$ by the p-type high impurity concentration layer 15, the n-type first semiconductor region 13 and the p-type semiconductor region 12.

On the other hand, on the second semiconductor region 14 is formed a high impurity concentration layer 16 with the same conductivity-type as the region 14.

Then, on-the portion between the first and second semiconductor regions 13 and 14 is formed a gate insulating film 17 made up of $SiO_2$ which is formed of, for example, the surface of the semiconductor substrate 11 being oxidized by heat and a gate electrode 18 made up of, for example, polycrystalline Si is formed thereupon to constitute a gate portion of the MOS transistor.

The respective high impurity concentration layers 15 and 16 are formed at a predetermined interval, for example, at an interval of 0.05 μm~0.2 μm relative to the gate portion. To this end, for example, the first and second semiconductor regions 13 and 14 are formed by ion implantation of an impurity with, for example, the gate electrode 18 and a resist layer (not shown) used at a time of pattern etching of the gate electrode 18 being as a mask. Thereafter, on the side surface of the gate electrode 18 is formed a side wall 19 and the high impurity concentration layers 15 and 16 are formed sequentially by the ion implantation with the side wall 19 and the gate electrode being used as a mask.

In this manner, with the first semiconductor region 13 of a photo-diode PD as a source region and the n-type second semiconductor region 14 as a drain region and with the gate electrode 18 being formed between them through the gate insulating film 17, the electric charge read-out MOS transistor (MOS) is constituted.

In portions of periphery of the sensor unit S and the transistor MOS forming unit and the like on the surface of the semiconductor substrate 11, where device separation is carried out among each other, a device separation insulating layer 21 consisting of $SiO_2$ is formed by, for example, a LOCOS (Local Oxidation of Silicon) and a high concentration channel stop region C. S of the first conductivity-type is formed thereunder.

Figure 4:
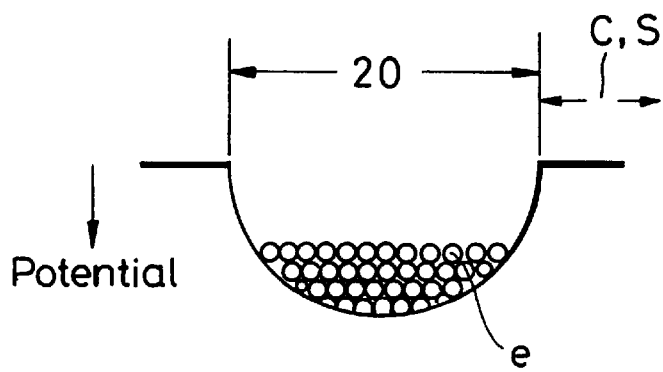
FIG. 4 is a potential diagram of a sensor unit.
Figure 6:
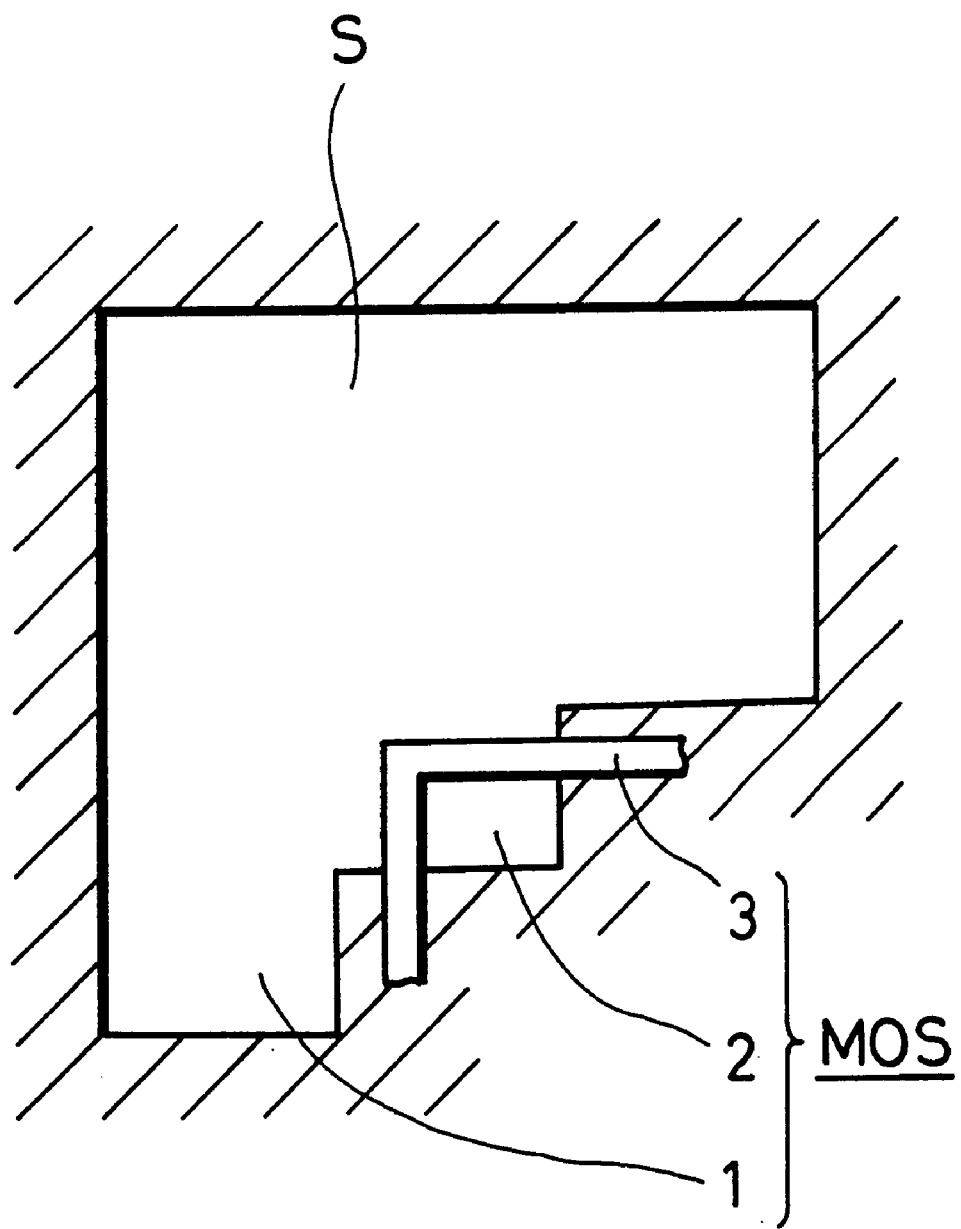
FIG. 6 is a pattern diagram of a sensor unit of a conventional solid state imaging device and its related insulating gate transistor.

Then, in the present invention, a potential of the signal electric charge, in this example, an electron e which occurs in the photoelectric conversion region 20 by light irradiation thereon is selected in its shape, pattern and the like so as to form one dip as diagrammatically shown in FIG. 4.

Meanwhile, selection of a pattern and a position of the gate electrode 18 of the MOS transistor, that is, the gate portion, is carried out in a way that it is extended above the central portion of the potential dip or its vicinity.

The patterns of the gate electrode 18 are such that, as shown in FIGS. 5A to 5E, the pattern of an opposing portion between the first semiconductor region 13 and the second semiconductor region 14, that is, the gate portion is made a pattern shape which convexly bends or curves toward the first semiconductor region 13 at the middle portion in terms of its channel width direction and as mentioned above, the gate electrode 18, that is, the gate portion is made able to be positioned above the central portion of the above-mentioned potential dip or its vicinity.

In order for the gate electrode 18, that is, the gate portion to be able to be positioned above the central portion of the potential dip or its vicinity, when the longer distance of the respective distances between the top of the middle portion, bending portion or curving portion of the gate electrode 18 and the both ends in the channel width direction is made d, the farthest distance D between the above-mentioned top portion and the periphery portion of the photoelectric conversion region 20 is positioned within three times the distance d (D≦3d).

As mentioned above, in the present invention, because the potential dip formed in the photoelectric conversion region is formed by a single number and at the same time, the gate electrode of the signal electric charge read-out MOS transistor is formed to extend above the central portion of the potential dip, that is, on the top of the dip or the vicinity of the top, it is possible to lower a read-out voltage as the read-out of the signal electric charge can be carried out from a portion lower than the highest portion of a potential barrier by, for example, the channel stop region C. S as shown in FIG. 4 in the periphery of the dip and further, it is possible to completely carry out the read-out of the signal electric charge.

Also, as mentioned above, since the so-called HAD structure wherein the high impurity concentration layer 15 is formed on the surface is employed, an accumulated layer of the electric charge (a hole when the signal electric charge is an electron) is formed therein, resulting in the accumulation of the signal electric charge in the semiconductor region 14 being enhanced and further since the dark current is suppressed, it is possible to implement an improvement in the fixed pattern noise of the MOS-type solid state imaging device. In the arrangement, as mentioned above, by making the high impurity concentration layer 15 separated from the gate portion, at a time of reading out the signal electric charge, it is possible to reduce the influence by the potential barrier due to the existence of the high impurity concentration layer 15 as well as to carry out the more complete read-out.

Meanwhile, in the above-mentioned examples, the arrangement is cited in which the MOS transistor is comprised of the $SiO_2$ gate insulating film, but the gate insulating film is not only limited to the oxidized film, but various kinds of insulating gate transistors can be comprised.

Also, the signal electric charge in the solid state imaging device is normally an electron, but in a case where the signal electric charge is a positive hole, the first conductivity-type can be selected to an n-type and-the second conductivity-type can be selected to a p-type or the like. In other words, the present invention is not limited to the above-mentioned examples but can make various kinds of modifications in the above-mentioned examples.

As mentioned above, according to the solid state imaging device of the present invention, by positioning the gate electrode of the MOS transistor for reading out the signal electric charge from the sensor unit thereof at the central portion of the potential dip in the sensor unit or in the vicinity of the central portion, it is possible to reduce the signal electric charge read-out voltage as well as to nearly completely read out the signal electric charge.

As a result, it is possible to further promote the advantages in reducing the drive voltage, that is, consumed power in the MOS-type solid state imaging device.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. In a solid state imaging device in which
   a plurality of unit pixels each having a sensor unit with a photoelectric conversion region in which a first semiconductor region of a second conductivity-type is formed in a semiconductor region of a first conductivity-type, and on a surface thereof, a high impurity concentration layer of a first conductivity type is formed and an insulating gate transistor for reading out a signal electric charge from said sensing unit, are disposed a solid state imaging device, being characterized in that said photoelectric conversion region of said sensor unit forms a single potential dip for the signal electric charge, and a gate electrode of said insulating gate transistor is formed into a pattern so that its middle portion in a channel width direction is positioned above a central portion of said potential dip or above a vicinity of the central portion of said potential dip.

2. A solid state imaging device as claimed in claim 1, wherein said middle portion of said insulating gate transistor is formed into a pattern which convexly bends or curves toward a forming portion of said first semiconductor region, and when a longer distance of respective distances between the top of said bending or curving pattern and both ends in said channel width direction is taken as d, a periphery portion of said photoelectric conversion region is placed in a position within three times as long as said distance d.

3. A solid state imaging device as claimed in claim 1, wherein a signal electric charge read out from said sensor unit is amplified by an amplifying means and becomes a signal voltage or a signal current.

4. A solid state imaging device as claimed in claim 3, wherein said amplifying means is comprised of an amplifying transistor in said unit pixel.

5. A solid state imaging device as claimed in claim 3, wherein said amplifying means is comprised of an amplifier provided at every column of arrangement of said plurality of unit pixels.

6. A solid state imaging device as claimed in claim 1, wherein a second semiconductor region of a second conductivity type, which opposes said first semiconductor region with said gate electrode being gripped; is formed to thereby form said insulating gate transistor.

* * * * *